United States Patent [19]
Benayoun et al.

[11] Patent Number: 5,701,468
[45] Date of Patent: Dec. 23, 1997

[54] SYSTEM FOR PERFORMING DATA COMPRESSION BASED ON A LIU-ZEMPEL ALGORITHM

[75] Inventors: Alain Benayoun, Cagnes Sur Mer; Jacques Fieschi, Saint Laurent Du Var; Patrick Michel, LaGaude; Jean-Francois LePennec, Nice, all of France

[73] Assignee: International Business Machines Corporation, Armonk, N.Y.

[21] Appl. No.: 444,139

[22] Filed: May 18, 1995

[30] Foreign Application Priority Data

Dec. 20, 1994 [EP] European Pat. Off. ............. 94480176

[51] Int. Cl.$^6$ ........................................... G06F 5/00
[52] U.S. Cl. ............................................... 395/612
[58] Field of Search ..................... 364/DIG. 1, DIG. 2; 395/611, 612, 376

[56] References Cited

U.S. PATENT DOCUMENTS 4,464,650  8/1984  Eastman et al. ........................ 340/347

FOREIGN PATENT DOCUMENTS 148008  11/1981  European Pat. Off. ..
127815  6/1986   European Pat. Off. ..
350281  1/1990   European Pat. Off. ..
860047  1/1986   WIPO .

OTHER PUBLICATIONS

IBM Technical Disclosure Bulletin, vol. 14, No. 11, Apr. 1972, "Representation of Tree Data Structures for Data Manipulation and Search Operations".

IBM Technical Disclosure Bulletin, vol. 24, No. 8, Jan. 1978, "General Purpose Database Structure".

IBM Technical Disclosure Bulletin, vol. 25, No. 11B, Apr. 1983, "Method for Deleting Records from a Hierarchical Data Base".

*Primary Examiner*—Robert B. Harrell

[57] ABSTRACT

Data compression using a Liv-Zempel algorithm is enhanced by organizing strings of data in a dictionary using a set of related four related fields. The first field contains an index or codeword for the last character of the string currently being processed. The second field contains an index or codeword for a SON string, a string which includes all of the characters of the current string plus one additional character. The third field contains an index or codeword for a BROTHER string which is identical to the current string except that the last characters in the two strings differ. The fourth field contains an index or codeword for a PARENT to the current string. The PARENT includes all of the characters of the current string except the last character. The memory arrangement comprises a tree structure which can be efficiently accessed by a disclosed processor to perform data compression using minimal processing resources.

10 Claims, 7 Drawing Sheets

SYSTEM FOR PERFORMING DATA COMPRESSION BASED ON A LIU-ZEMPEL ALGORITHM

TECHNICAL FIELD OF THE INVENTION

The invention relates to data communication systems and particularly a method and device for data compression of individual sequence of strings of a data stream which is based on the use of a dictionary consisting of a set of strings with an index for each string.

BACKGROUND ART

Data compression methods are well known in the art, particularly in the telecommunication art.

A basic algorithm, known under the name of Ziv and Lempel, is disclosed in an article entitled "Compression of Individual Sequences via Variable Rate Coding" by Ziv and Lempel published in the IEEE Transactions on Information Theory IT-24 pp 530–536.

EP 127 815 entitled "Data compression method", assigned to the assignee of the present invention, discloses a data compression method which enhances the Ziv and Lempel algorithm by particularly providing a method which comprises the steps of: initializing a dictionary consisting of a set of strings with an index for each of said strings and including all possible strings of length 1; setting a current input position at the beginning of said data stream and repeating the following steps until the data stream to be compressed is exhausted; determining a longest string in said dictionary which matches a current string in the data stream starting from the current input position; generating an identifier I for S consisting of an encoding of the index associated with said longest matched string S; advancing the current input position to immediately after said current string in the data stream; modifying said dictionary based on the preceding longest matched string S, the immediately succeeding symbols in the next string in the data stream, and the sequence of previously matched strings; transmitting I to a utilization device; and decoding I at said utilization device to recover said string S.

CCITT V.42bis Recommendations particularly deals with a method for performing data compression. However, the implementation of such a method still involves the use of large processing resources. However, these documents do not reveal how to implement the algorithm in such a way as to facilitate the manipulation of the strings that are involved in the compression mechanism, or to make easier the numerous accesses to the memory which stores the dictionary.

SUMMARY OF THE INVENTION

The problem solved by the present invention is how to provide an efficient data compression method and device to enhance storage efficiency and transmission efficiency.

This problem is solved using a dictionary which is initialized and which consists of a set of strings of data with an index or a codeword for each of said strings and which includes all possible strings of length 1. The dictionary is stored in a memory storage which is addressed by the current index, or codeword corresponding to a current string of the dictionary. With the invention, the memory is organized in such a way as to take into account the relationship of the different strings within a tree structure. This is achieved by arranging each data entry stored in the memory in four distinctive fields.

A first field defines the index or the codeword of the last character of the current string being addressed in the memory.

A second field defines the index or the codeword of the string (SON) that comprises the current string plus an additional character and which is the first string which is created after the current string being accessed in the memory.

A third field defines the index or the codeword of the string (BROTHER) which appears within the dictionary after the creation of the current string being accessed in the memory and which has the same common characters the current string except for the last character.

Finally, a fourth field defines the index of the string (PARENT) that comprises all the characters of said current string except the last minus the last character.

Therefore, the SON, BROTHER and PARENT relationships between the different strings in the dictionary are represented in the organization of the memory that physically stores the dictionary. This results in easier manipulation of the different indexes or codewords which are needed for the data compression process and requires less processing resources from the processor.

The invention provides a new processor structure that can advantageously embody the method which is defined above. The processor is connected by an external bus to a memory storage which is used for storing the dictionary and further comprises:

an internal bus (650);

a first set of four registers (701, 702, 703, 704) connected between said external and said internal bus for storing data representative of said dictionary read from said memory storage; said first set comprising a first, second, third and fourth latches for respectively storing the first, second, third and fourth fields of the data read from said memory storage;

a second set of four registers which are all connected between said external and said internal bus for storing data representative of said dictionary read from said memory storage; said second set comprising a first, second, third and fourth latches for respectively storing the first, second, third and fourth fields of the data extracted from said memory storage;

a program counter register for storing the instruction address for addressing said at least one memory storage;

a processing unit for receiving the instructions stored into said at least one memory storage and for generating control signals needed by said processor.

This processor facilitates the independent access to the different fields of the data stored within the memory and allows the design of a powerful data compression mechanism based on the use of a dictionary.

The invention is adapted for any data compression method or device which is derived from the so called ZIP-LEMPEL compression algorithm. In particular, the invention is well suited for embodying the CCITT V.42 bis recommendations.

DESCRIPTION OF A PREFERRED EMBODIMENT OF THE INVENTION

Figure 1:
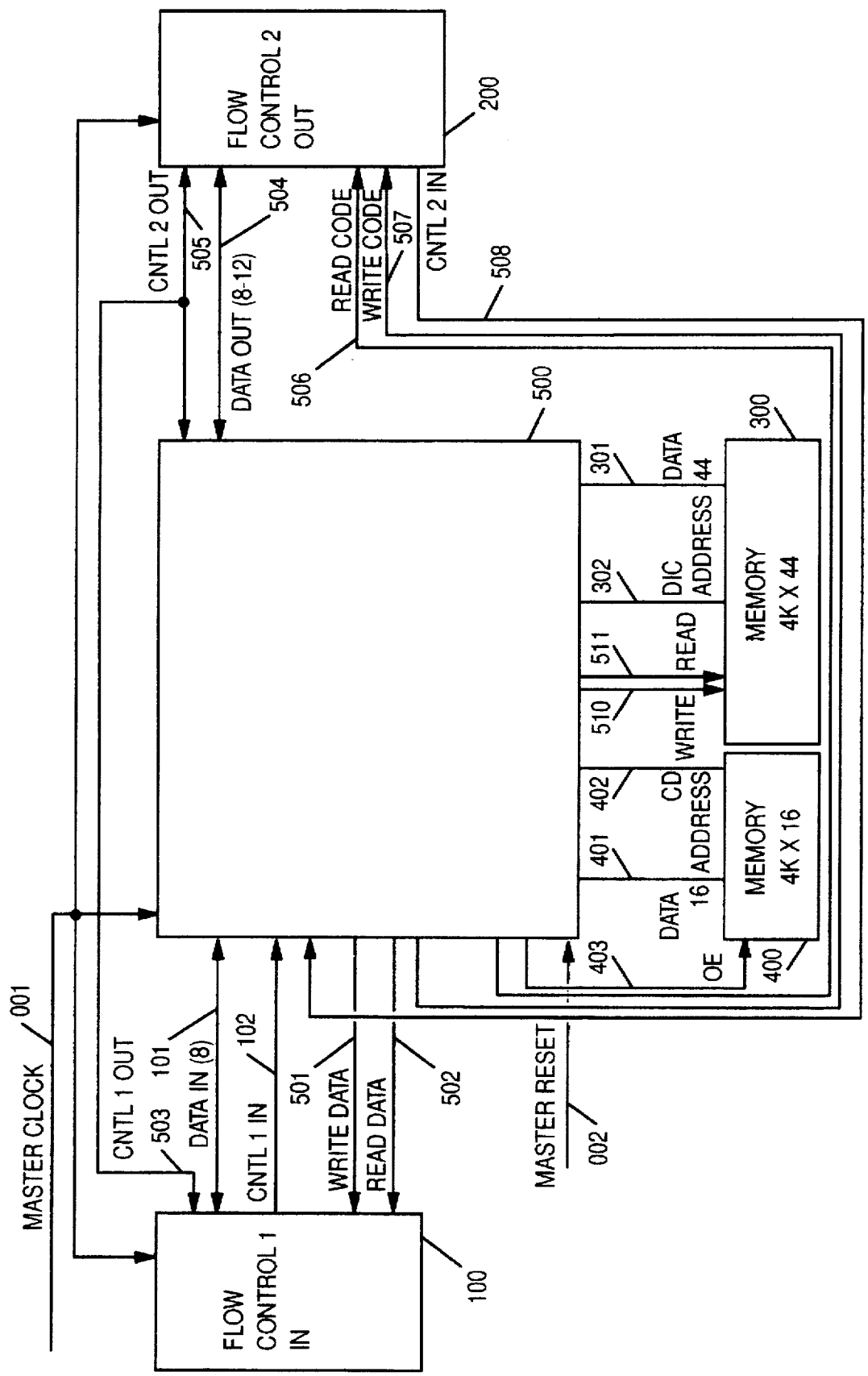
FIG. 1 is a general view of the architecture of the processor according to the present invention.

FIG. 1 provides a general view of the architecture of the specialized compression processor in accordance with the present invention. A processor 500, which is represented as a 'black box' in this figure for clarity's purpose, is designed to communicate with flow control circuit 100 thereby managing the DTE data flow which is received from and transmitted to the DTE. The flow of data is transmitted and received to the processor 500 via a DATA_IN bus 101. DATA_IN bus 101 is a 8 bit bus in the preferred embodiment of the invention. Processor 500 has a set of WRITE_DATA and READ_DATA control leads 501 and 502 which are respectively used for writing and reading the data in flow control_1_IN circuit 100. For instance, assuming that the processor 500 wishes to extract a byte from this circuit, this is achieved by activating the READ_DATA control signal on lead 502. A set of additional CNTL_1_IN and CNTL_1_OUT control busses 102 and 503 are respectively used for a set of control codes used for the management of the flow control and which will be described more hereinafter. In the preferred embodiment of the invention, busses 102 and 503 take the form of 4-bit busses.

Similarly, on the other side, a flow-control_2_OUT circuit 200 is used for managing the data flow of the DCE converter.

The latter flow of data, having the form of codewords of variable length as defined in CCITT rec. V 42bis, is transmitted and received to the processor 500 via a DATA_OUT bus 504. DATA_OUT bus 504 is a 12 bit bus, with 8 to 12 significant bits being relevant in accordance with the state of the compression process. Processor 500 has a set of WRITE_CODEW and READ_CODEW control leads 507 and 506 which are respectively used for writing and reading the data in flow control 2 circuit 200. For instance, assuming that the processor 500 wishes to write a codeword into this circuit 200, it performs this by activating the WRITE_CODEW control signal on lead 507. A set of additional CNTL_2_IN and CNTL_2_OUT control busses 508 and 505 are respectively used for a set of control codes used for the management of the flow control and which will be described more hereinafter. Similarly, buses 508 and 505 are 4-bit buses.

A set of two memory circuits 400 and 300 is used for respectively storing the program instructions for the processor 500 and the dictionary entries, as will be described hereinafter with greater details. In the preferred embodiment of the invention, memory circuit 400 is organized to store 16 bit instruction words while memory circuit 300 is arranged to store 44 bit dictionary entries. As will be mentioned later, each 44 bit entry is composed of four distinctive fields: a 8 bit field for the data, and a set of three 12 bit fields, each field will be allocated to pointers characterizing the data relationship within the tree structure of the dictionary.

Memory circuit 400 communicates with processor 500 by means of a 16 bit data bus 401, a CO_ADDRESS address bus 402 made up of 12 bits. The addressing of memory circuit 400 is performed by means of the activation of OE output enable control lead 403 by processor 500, which causes the memory circuit to provide the data stored at the address simultaneously existing on address bus 402.

Memory circuit 300 communicates with processor 500 by means of a 44 bit data bus 301, a DIC_ADDRESS address bus 302 made up of 12 bits. The addressing of memory circuit 400 is performed by the traditional WRITE and READ control signals which are carried on leads 510 and 511.

A additional MASTER_RESET control lead 002 is used for controlling the general reset of the processor 500. At last, a clock signal is provided to each circuit on a lead 001.

Figure 2:
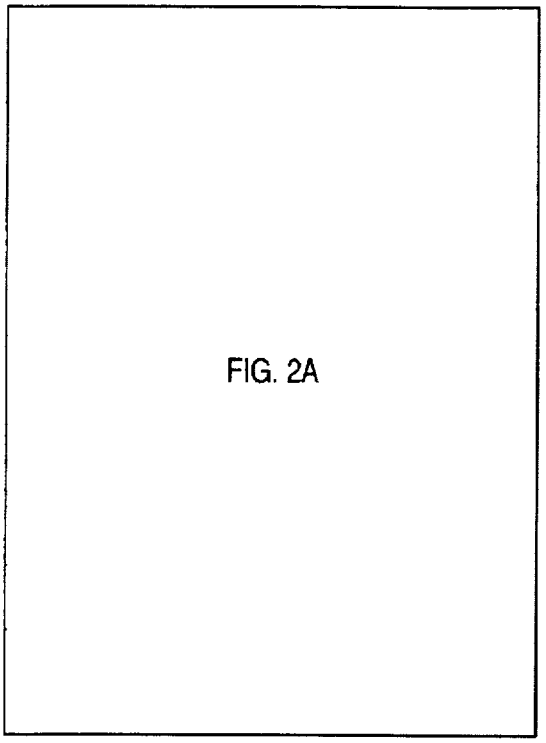
FIG. 2 illustrates the arrangement of FIGS. 2A and 2B.
Figure 2:
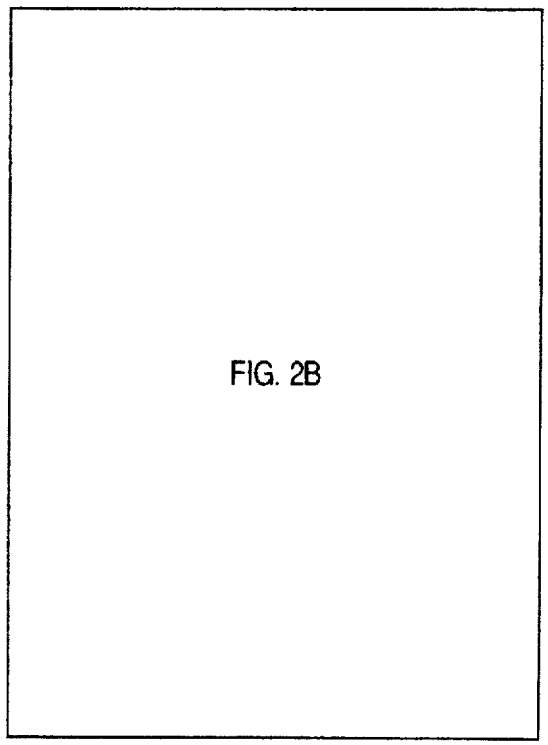
Figure 2A:
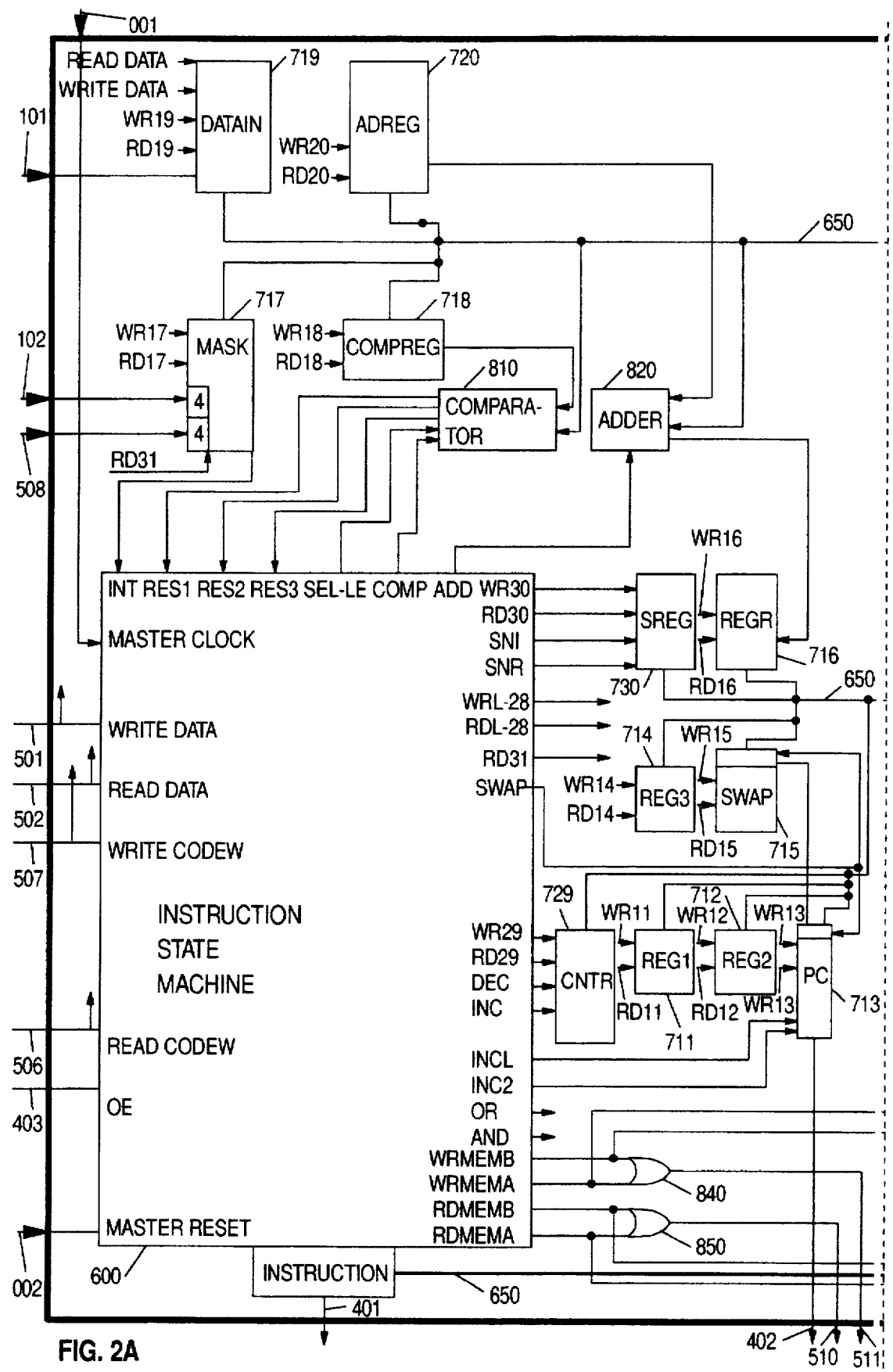
FIGS. 2A and 2B illustrate the structure of the processor in accordance with the present invention.
Figure 2B:
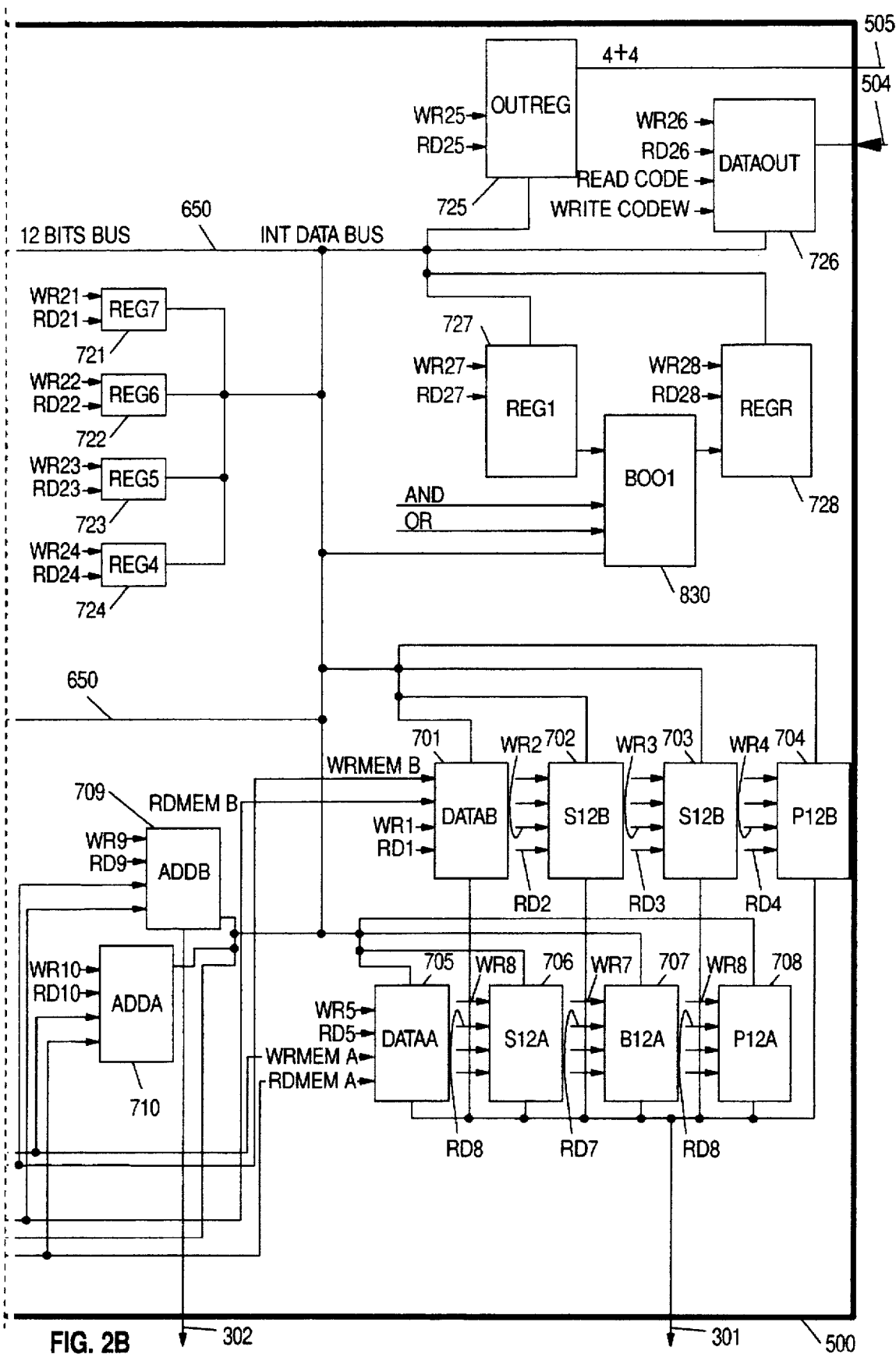

FIG. 2 shows the particular arrangement of FIGS. 2A and 2B in order to provide a full and comprehensive view of the internal structure of processor 500. The latter is based upon an Instruction State machine 600 which is made up of some combinatory logic and which provides all the control signals used for performing the compression process. Firstly, instruction state machine 600 receives the already mentioned master clock on lead 001, master reset on lead 002, the instructions commands from memory circuit 400 via data bus 401. Conversely, state machine 600 provides with the output signals WRITE_DATA on lead 501, READ_DATA on lead 502, WRITE_CODEW on lead 507, READ_CODEW on lead 506 and the OE signal on lead 403.

Additionally, state machine 600 provides 30 sets of write and read control signals, respectively referred to from WR1/RD1 to WR30/RD30, each of said set of control signals being used for controlling one among a set of 30 associated registers 701-730. All these 30 registers are bi-directional tri-state registers which are all connected together via an 12 bit internal data bus 650. The WR1 write and RD1 read control signals is used for controlling a register 701. Similarly, the WR2 write and RD2 read control signals are used for controlling a second register 702; the WR3 write and RD3 read control signals are used for controlling a third register 703; the WR4 write and RD4 read control signals are used for controlling a fourth register 704, etc.

At last, the WR30 write and RD30 read control signals are used for controlling a thirtieth register 730.

Instruction state machine 600 also provides a set of control signals which is used for the controlling the reading and the writing of the memory circuit 300. these include WRMEM_A, WRMEM_B, RDMEM_A, RDMEM_B control signals. WRMEM_A and WRMEM_B are transmitted to the two input leads of an OR gate 840 which has an output carrying the READ signal on lead 511. RDMEM_A and RDMEM_B are transmitted to the two input leads of an OR gate 850 which has an output carrying the already mentioned WRITE signal on lead 510.

Instruction state machine 600 provides a set of control signals which is used for controlling a program counter register 713 which contains the instruction address for addressing the memory circuit 400. This set of control signals includes an INC1 and INC2 control signal for controlling the incrementation performed within program counter register 713. In accordance with the activation of one of the two INC1 and INC2 control signals, the incrementation performed by register 713 is made by one or two steps. As mentioned before, register 713 also receives the two WR13/RD13 control signals which are provided by state machine 600.

Instruction state machine 600 provides a DEC decrementation control signal and a INC incrementation control signal which are both transmitted to counter register 729, which, as mentioned before, also receives the two WR29/RD29 control signals from state machine 600.

A set of two AND and OR control signals is also generated by state machine 600 and transmitted to two input leads of a BOOL circuit 830. Circuit 830 also receives the contents of internal data bus 650 and the output bus of a REGL register 727. In accordance with the level of the two AND and OR control signals provided by state machine 600, BOOL circuit 830 performs an AND or OR logic operation on the contents of bus 650 and the output bus of REGL register 727.

Instruction state machine circuit 600 provides a SWAP control signal which is used for controlling the mutual exchange of the contents of program counter 713 and a SWAP register 715. As mentioned above, the latter also receives the two RD15 and WR15 control signals generated by circuit 600. In a Low Sensitive Scan Design (LSSD) environment such a swap operation can be directly performed since two distinctive latches are used for every latch cell. In a non LSSD environment, such a operation is still straightforward to the skilled man and will not be further detailed.

Additionally, state machine 600 provides a set of two SHL shift left and SHR shift right control signals which are transmitted to two input leads of a SREG shift register 730, which, as mentioned before also receives the WR30 and RD30 control signals. This register is used for performing the traditional shift function, either to the left or to the right.

An ADD control signal is also provided by state machine circuit 600 which is used for controlling an ADDER arithmetic adder 820. Adder 820 has two input busses which respectively receives the contents of a ADREG register 720 and that of the internal data bus 650. The result of the addition thus performed is transmitted to the input bus of a REGR register 716. The registers 720 and 716 respectively receive the WR20/RD20 and WR16/RD16 control leads.

A comparator 810 receives a COMP control signal from instruction state machine circuit 600 as well as a SEL_LE (selection length) control signals from the same circuit. SEL_LE control signals are carried on a 3 bit bus. Comparator 810 also receives the contents of a COMPREG register 718 and that of internal bus 650. Upon the activation of COMP control signal generated by circuit 600, and in accordance with the contents of SEL_LE bus, comparator performs the comparison of the 8 to 12 bits of both the output bus of COMPREG register 718 and the internal bus 650. The result of the latter comparison is carried by a set of three RES1, RES2 and RES3 output leads which are connected to state machine 600. In the preferred embodiment of the invention, RES1 output lead or RES2 output lead is activated when the contents of the internal bus 650 appears to be respectively inferior or to that of COMPREG register 718. Finally, RES3 indicates that both contents are equal.

CNTL_1_IN bus and CNTL_2_IN bus control signals on lead 102 and 508 are respectively transmitted to two inputs of a MASK register 717 which is under control of state machine 600. The contents of MASK register 717 can be read and written (via internal bus 650)by means of WR17 and RD17 control signals generated by state machine 600. As soon as MASK register 717 detects a change in the level of the signals carried by one of the two busses 102 and 508, this causes an interrupt signal to be generated at the INT output lead which is transmitted to state machine 600 in accordance with the contents of the interrupt bits mask stored in register 717. The status of all the incoming lines of both busses 102 and 508 can be read by means of a RD31 control signals generated by state machine 600.

The flow of data which is conveyed by DATA_IN bus 101 is transmitted to the input bus of a DATA_IN register 719 which is also connected to internal data bus 650. Register 719 is controlled by means of Write Data and Read Data control signals on lead 501 and 502 in order to transmit data to or receive data from bus 101. Similarly, WR19 and RD19 control signals are used in order to control the access to bidirectional bus 650.

On the other side, the flow of data which is conveyed by DATA_OUT bus 504 is transmitted to the input bus of a DATAOUT register 726 which is also connected to internal data bus 650. Register 726 is controlled by means of WRITE_CODEW and READ_CODEW control signals on lead 507 and 506 respectively in order to transmit a codeword to or receive a codeword from bus 504. Similarly, WR26 and RD26 control signals are used in order to control the access to bidirectional bus 650.

An OUT_REG register 725 is connected to internal data bus 650 to which access is controlled by the set of WR25 and RD25 control signals. The contents of register 725 is continuously presented on CNTL_2_OUT bus 505 and CNTL_1_OUT bus 503.

A set of 4 registers 705–708 which are connected to external bus 301 and internal data bus 650 allows the interface with memory circuit 300. The four registers share the different signals carried by bus 44. Indeed the latter is organized as follows:

bit 0–7: data bit 8–19: S12 (the twelve bits of the SON codeword) bit 20–31: B12 (the twelve bits of the BROTHER codeword) bit 32–43: P12 (the twelve bits of the PARENT codeword).

Register 705, which is referred to as DATA_A register, receives the bits 0–7 of external bus 301. Register 706, which is referred to as S12_A register, receives the bits 8–19 of external bus 301. Register 707, which is referred to as B12_A register, receives the bits 20–31 of external bus 301. Register 708, which is referred to as P12_A register, receives the bits 32–43 of external bus 301. The access of registers 705–708 to external bus 301 is simultaneously controlled by means of write (WR_MEM_A) and read (RD_MEM_A) control signals which are generated by state machine 600. Registers 705–708 can also access the internal bus 650. However, this access can be performed separately since each register is controlled by its own write and read control signals. Register 705 is controlled by WR5 and RD5 control signals generated by state machine 600 while register 706 is under control of WR6 and RD6 control signals. Similarly, register 707 is controlled by WR7 and RD7 control signals and register 706 is under control of WR7 and RD7 control signals.

There is an additional set of four registers 701–704 which are all connected to external bus 301 and internal data bus 650. These allow, as above, the interface with memory circuit 300. Register 701, which is referred to as DATA_B register, receives the bits 0–7 of external bus 301. Register 702, which is referred to as S12_B register, receives the bits 8–19 of external bus 301. Register 703 which is referred to as B12_B register, receives the bits 20–31 of external bus 301. Register 704, which is referred to as P12_B register, receives the bits 32–43 of external bus 301. The access of registers 701–704 to external bus 301 is simultaneously controlled by means of write (WR_MEM_B)and read (RD_MEM_B) control signals which are generated by state machine 600. Registers 701–704 can also access the internal bus 650. However, as before, this access can be performed separately since each register has its own write and read control signals. Register 701 is controlled by WR1 and RD1 control signals generated by state machine 600; register 702 is under control of WR2 and RD2 control signals; register 703 is controlled by WR3 and RD3 control signals; and, at last register 704 is controlled by means of WR4 and RD4 control signals.

An ADD_A register 710 can be accessed by internal data bus 650 and is used for providing memory circuit 300 with the 12 bits of the address on DIC ADDRESS bus 302. This will allow the access of memory circuit 300 by state machine 600 for the purpose of upgrading the dictionary (when in write operation) or for reading a line of the dictionary (when in read operation). This register has its bus connected to that of registers 705–708. To achieve this, register 710 is controlled the WR_MEM_A write control signal as well as RD_MEM_A control signal.

An ADD_B register 709 can be accessed by internal data bus 650 and is used for providing memory circuit 300 with the 12 bits of the address on DIC ADDRESS bus 302. This will allow the access of memory circuit 300 by state machine 600 for the purpose of upgrading the dictionary (when in write operation)or for reading a line of the dictionary (when in read operation). This second register is associated with registers 701–704. To achieve this, register 710 is controlled the WR_MEM_A write control signal as well as RD_MEM_A control signal.

Below is represented a table which develops the set of instructions which can be used by the processor which was described above. Each instruction is a 16 bit word which comprises a first 4 four bit field defining a particular instruction. Two additional 6 bit fields are used for defining one or two operands.

| Instruction (4 bits) | Destination operand (6 bits) | Source op. |
| --- | --- | --- |
| 0001 (move) | destination | Source |
| 0010 (compare) | the contents of SEL_LE bus and RES selection | Source |
| 0011 (ADD) | — | Source |
| 0100 (AND) | — | Source |
| 0101 (OR) | — | Source |
| 0110 (ILOAD) | data (MSB) | data (LSB) |
| 0111 (Indirect JUMP) | — | Source |
| 1000 (SHIFTLEFT) | — | — |
| 1001 (SHIFTRIGHT) | — | — |
| 1010 (INC) | — | — |
| 1011 (DEC) | — | — |
| 1100 (SWAP) | — | — |
| 1101 MOVE EXTERNAL | type of move | |
| 1111 (Immediate JUMP) | Address (MSB) | Address (LSB) |

The MOVE instruction initiates movement of the contents of a register defined by the SOURCE operand into the register defined by the destination operand. To achieve this, state machine 600 activates both the read control signal defined by the source operand and the write control signal which is defined by the DESTINATION operand. For example, assuming that a move of the contents of register 705 to register REG4 register 724, the following instruction will be used: "0001/01100/000101" since 0001 represents the instruction MOVE; 01100 represents the binary coding of the value "24" (standing for register 724) and 000101 being the binary coding of the value "5" which characterizes the register 705.

The COMPARE instruction provides the comparison of the contents of the register which is defined by the SOURCE operand with that of COMPREG register 718. The three LSB bits of the DESTINATION operand defines the contents of the SEL_LE bus, that is to say the number of bits which will be used for performing this comparison. Therefore, when decoding the COMPARE instruction, state machine 600 generates those three bits on the SEL_LE bus so that comparator 810 performs a comparison of the 8 to 12 least significant bits of COMPREG register 718 and the register which is defined by the SOURCE operand (for instance and as previously, REG3 register 714 has an address which is equal to "001110", the binary coding of the number 14). The result of the comparison is transmitted to processor 600 via its RES1, RES2 and RES3 leads. The final selection of the RES signal among the three RES1, RES2 and RES3 leads is made by state machine 600 in accordance with the contents of the 3 MSB bits contained in the DESTINATION operand.

The ADD instruction performs the arithmetic addition of the contents of ADREG register 720 with that of the register which is defined by the SOURCE operand. To achieve this, upon the decoding of an ADD instruction, state machine 600 activates the ADD control signal which is transmitted to ADDER circuit 820, as well as the READ signal of the register defined by the SOURCE operand. The contents of that register is therefore transmitted to the internal bus 650 and therefore, ADDER circuit 820 computes the addition of the latter with the contents of ADREG register 720. The result is stored into REGR register 716.

The AND instruction results in an AND operation of the contents of REGL register 727 and that of the register which is defined by the contents of the SOURCE operand. To achieve this, when decoding an AND instruction, state machine 600 activates the AND control signal which is transmitted to BOOL circuit 830, and the READ control signal of the register which address is defined by the SOURCE operand. Therefore, BOOL circuit 830 performs the bit to bit AND operation of the contents of that register with that of REGL register 727. The result is then transferred into REGR register 728.

Similarly, the OR instruction results in an OR operation of the contents of REGL register 727 and that of the register which address is defined by the contents of the SOURCE operand. To achieve this, when decoding an OR instruction, state machine 600 activates the OR control signal which is transmitted to BOOL circuit 830, and the READ control signal of the register which has the address defined by the SOURCE operand. Therefore, BOOL circuit 830 performs the bit-to-bit OR operation of the contents of that register with that of REGL register 727. The result is then transferred into REGR register 728.

The ILOAD instruction results in the loading of the REG1 register 712 with a data which is defined by the contents of the destination and source operand, the destination operand forming the 6 most significant bits while the source operand forms the 6 least significant bits. To achieve this, when state machine 600 decodes the ILOAD instruction, it activates the WR11 control signal and also transfers on the bus 650 the contents of the 12 least significant bits which are carried by bus 401 and which forms both the destination and source operands.

The INDIRECT JUMP instruction results in the transfer into PC register 730 of the contents of the register whose address is defined by the SOURCE operand. To achieve this, when decoding an INDIRECT JUMP instruction, state machine 600 activates the READ control signal of the SOURCE register and the WR13 write control signal which is transmitted to PC register 713.

The SHIFT LEFT (SHL) instruction is used for performing the shift function to the left of the contents of the SREG register 730. To achieve this, upon decoding a SHIFT LEFT instruction, state machine 600 activates the SHL control signal which is transmitted to SREG register 730.

Conversely, the SHIFT RIGHT (SHR) instruction is used for performing the shift function to the right of the contents of the SREG register 730. To achieve this, upon decoding a SHIFT LEFT instruction, state machine 600 activates the SHR control signal which is transmitted to SREG register 730.

The INC instruction is used for performing the incrementation of the CNTR register 729, by the activation of the INC control lead which is connected to CNTR register 729.

Similarly, the DEC instruction is used for performing the decrementation of the CNTR register 729, by the activation of the DEC control lead which is connected to the latter register. Therefore, CNTR register 729 is capable of either incrementing or decrementing its contents in accordance with the control signal carried by INC or DEC control lead generated by state machine 600.

The SWAP instruction is used of controlling the mutual exchange of the contents of program counter 713 and SWAP register 715. When state machine 600 decodes the existence of the SWAP instruction on the instruction bus 401, it generates the SWAP control signal which is transmitted to both program counter 713 and SWAP register 715.

The MOVE EXTERNAL instruction provides a set of 8 individual moves of data between the processor 500 and one among the external devices 100, 200 and 300 in accordance with the contents (referred to a the TYPE of the move) of the DESTINATION operand.

A first type of move (READ_DATA) allows the transfer of data provided by FLOW_CONTROL_1_IN circuit 100 into DATA_IN register 719. To achieve this, when decoding a MOVE EXTERNAL instruction of this type, state machine 600 activates READ_DATA lead 502 which is transmitted to both circuit 100 and the READ_DATA input lead of register 719.

A second type of move (WRITE_DATA) allows the transfer of data provided by DATA_IN register 719 to FLOW_CONTROL_1_IN circuit 100. To achieve this, when decoding a MOVE EXTERNAL instruction of this second type, state machine 600 activates WRITE_DATA lead 501 which is transmitted to both circuit 100 and to the WRITE_DATA lead of register 719.

A third type of move (READ_CODEWORD) allows the transfer of data provided by FLOW_CONTROL_2_OUT circuit 200 into DATA_OUT register 726. To achieve this, when decoding a MOVE EXTERNAL instruction of this third type, state machine 600 activates READ_CODEWORD lead 506 which is transmitted to both circuit 200 and to the READ_CODEWORD input lead of register 726.

A fourth type of move (WRITE_CODEWORD) allows the transfer of data provided by DATA_OUT register 726 to FLOW_CONTROL_2_OUT circuit 200. To achieve this, when decoding a MOVE EXTERNAL instruction of this fourth type, state machine 600 activates WRITE_CODEWORD lead 507 which is transmitted to both circuit 200 and to the WRITE_CODEWORD input lead of register 726.

A fifth type of move (READ_MEM_to_A) allows the transfer of data from memory 300 from an address defined by the contents of ADDA register 710 to the set of registers 705, 706, 707 and 708. To achieve this, when decoding a MOVE EXTERNAL instruction of this fifth type, state machine 600 activates RDMEMA lead which is connected to an input of OR gate 850 and is also used to access the respective contents of DATAA register 705, S12A register 706, B12A register 707 and P12A register 708. Therefore, the output of OR gate 850 activates READ input lead 511 of memory 300.

A sixth type of move (READ_MEM_to_B) allows the transfer of data from memory 300 which address is defined by the contents of ADDB register 709 to the set of registers 701, 702, 703 and 704. To achieve this, when decoding a MOVE EXTERNAL instruction of this sixth type, state machine 600 activates RDMEMB lead which is connected to an input of OR gate 850 and is also used to access the respective contents of DATAB register 701, S12B register 702, B12B register 703 and P12B register 704. Therefore, the output of OR gate 850 activates READ input lead 511 of memory 300.

A seventh type of move (WRITE_MEM_to_A) allows the transfer of data to memory 300 at the address being defined by the contents of ADDA register 710 from the set of registers 705, 706, 707 and 708. To achieve this, when decoding a MOVE EXTERNAL instruction of this seventh type, state machine 600 activates WRMEMA lead which is connected to an input of OR gate 840 and is also used to access the respective contents of DATAA register 705, S12A register 706, B12A register 707 and P12A register 708. Therefore, the output of OR gate 840 activates WRITE input lead 510 of memory 300.

A eighth type of move (WRITE_MEM_to_B) allows the transfer of data to memory 300 at the address being defined by the contents of ADDB register 709 to the set of registers 701, 702, 703 and 704. To achieve this, when decoding a MOVE EXTERNAL instruction of this eighth type, state machine 600 activates WRMEMB lead which is connected to an input of OR gate 840 and is also used to access the respective contents of DATAB register 701, S12B register 702, B12B register 703 and P12B register 704. Therefore, the output of OR gate 840 activates WRITE input lead 510 of memory 300.

The Immediate Jump instruction results in the transfer into PC register 730 of an address which is defined by the contents of the destination and source operands. The destination operand forms the 6 most significant bit of that address while the source operand forms the 6 least significant bits of that address. To achieve this, when decoding an Immediate Jump instruction, state machine 600 activates the WR13 control lead which is connected to PC register 713. Also, state machine 600 transfers the contents of the 12 least significant bits of the bus 401 onto internal bus 650 so as to load the contents within register 713.

It should be noticed that the set of instructions which are defined below is not exhaustive and that additional instructions can be introduced in the processor of the invention. Generally speaking, the sequencing is based on the the operation of PCREG register 713. The two states and the raising and falling edge of the master clock signal which is provided throughout the machine on lead 100 are used as follows. In the preferred embodiment of the invention, on the rising edge of the master clock signal, state machine 600 fetches the instruction on bus 401, the address of which is stored within PCREG register 713. This is achieved by activating the OE control signal on lead 403 which is transmitted to storage 400. The instruction is therefore transferred from that memory onto bus 401. On the positive state following the rising edge, state machine 600 performs a decode of the instruction and generates all the logical states which are necessary to control the circuits which are involved in the instruction being decoded. Once the states are fixed, on the falling edge of the master clock signal, state machine produces the necessary pulses which are needed for completing the execution of the instruction, It should be noticed that such a sequencing is well known in the art of RISC (Reduced Instruction Set Computer . . . ) processors.

Such processor usually performs the reading, the decoding and the execution of one instruction within one clock period. When the execution of an instruction completes on the negative state of the master clock on lead 001, the PCREG register 713 is either swapped (involving the SWAP register 715), either reset, or incremented by one or two in accordance with the execution of the instruction.

The reset of PCREG register 713 is performed when an master reset control signal is received on lead 002.

The swapping of PCREG register 713 with register 715 is performed either on the decoding and execution of a SWAP instruction mentioned below, or, at the completion of one instruction, when an interrupt control signal is generated at the INT output lead of MASK register 717.

At the end of the execution of each instruction (except for the SWAP instruction), the incrementation of the PCREG register 713 is controlled in accordance with the state of the one of the three RES1, RES2 and RES3 signals which is considered in the particular COMPARE instruction being processed. If the one among the RES1, RES2 or RES3 signal being considered carries a '0' level, state machine 600 activates INC1 control signal which increments PCREG register 713 by one. Conversely, if the signal carries a '1', state machine 600 activates INC2 control signal which increments PCREG register 713 by two. Also, state machine 600 activates INC1 control signal in order to increment by one PCREG register 713 by default, that is to say when an instruction other than COMPARE is being processed.

The structure which was described above is particularly designed for providing the encoding and decoding mechanisms in accordance with the V42bis data compression procedures.

Briefly, the encoding mechanism is based on the use of a codeword having a certain length. Each character which is received from the DTE through the interchange circuit forms part of a string of characters which is then represented by a characterizing codeword. This process employs and maintains a dictionary in which strings are stored with their corresponding codeword. The dictionary is dynamically updated in the course of the encoding mechanism.

The codewords which are received from the signal converter through the error control functions are then decoded by the decoding mechanism in order to regenerate the original string of characters. To achieve this, a second dictionary is involved for the decoding mechanism is also continuously updated.

To perform the data compression and decompression process, a particular tree structure is used in the preferred embodiment of the invention which will be explained in reference with an illustrative example.

Let us assume, for instance, that the dictionary comprises the following strings of characters at a given time. The table below illustrates the status of the dictionary.

| Dictionary Entry | associated codeword |
|---|---|
| BU | |
| BUT | |
| BR | |
| BRI | |
| BRIN | |
| BRIQ | |
| BRIQU | |
| BRIQUE | |
| BRID | |
| BRIDE | |
| BRA | |
| BRAV | |
| BRAVO | |

| Dictionary Entry | associated codeword |
|---|---|
| BRE | |
| BREVE | |
| BREVET | |

Figure 5:
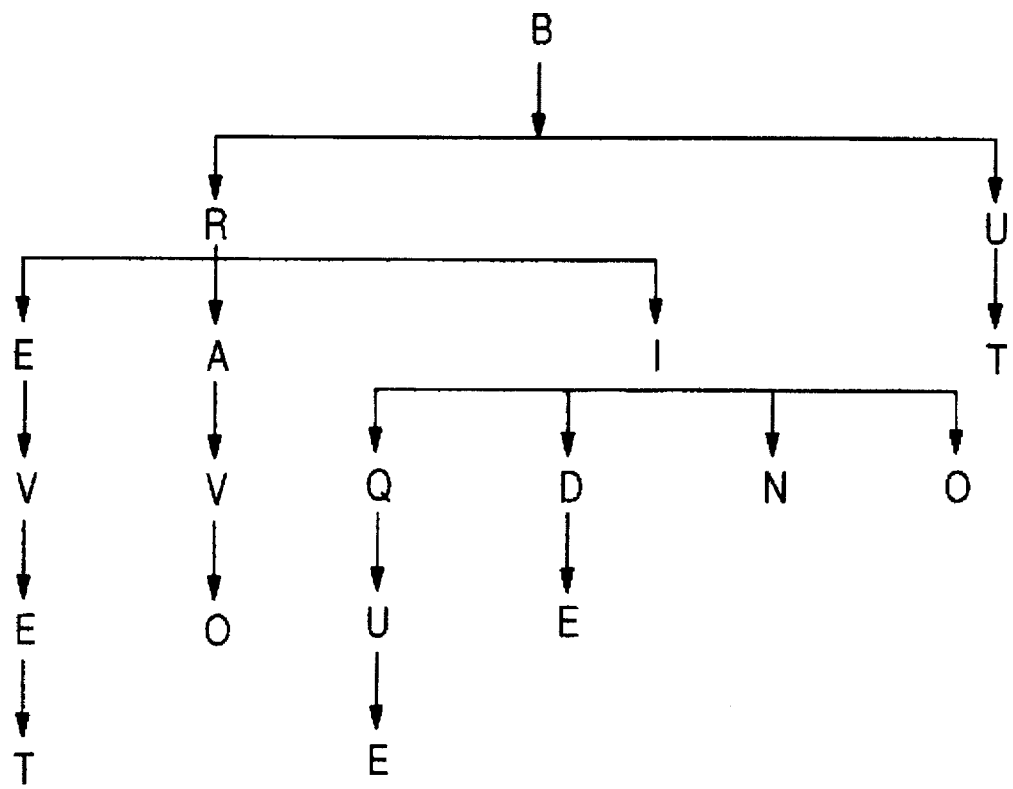
FIG. 5 illustrates a tree representation of coded strings example.

This tree structure is illustrated in FIG. 5 of the present application.

In the preferred embodiment of the invention, a very specific arrangement of the memory 300 which stores the dictionary has been designed. The organization of the memory, illustrated with reference to table 2, complies with what follows.

The first physical locations of the memory are generally used for storing control codewords. The next locations are then allocated to the storage of the ASCII characters. The next locations are then reserved for the storage of the dictionary.

Each physical location of the memory is used for characterizing a string which is created within the dictionary (the first locations which are not used for controls codewords or assigned to the storage of the ASCII characters). The physical address of this string defines the codeword which is associated to this string.

In accordance with the present invention, the 44 bits data of memory 300 are organized in a set of four distinctive fields.

The first field corresponds to the codeword of the last character of the field. Thus, with reference to table 2, the string "BRI" is characterized by a codeword '267'.

Therefore, when processor 500 reads memory 300 at the physical address '267', the memory provides a 44 bit data unit, the 8 most significant bits providing the value '76' which represents the codeword of the character "I". Similarly, the addressing of memory 300 at address '273' (being the codeword of string "BRAVO") returns a 44 bits data which eight MSB are the codeword ('82') of character "O".

The second field of the 44 bit data unit of memory 300 defines the codeword of the string (SON) that comprises the string being considered (defined by the address of the 44 bits data) plus an additional character and which, also, is the first string that chronologically follows the creation of the considered string. With respect to our example again, the string being considered is "BRI". Table 2 reveals that the first string being created within the dictionary that incorporates the string "BRI" plus one additional character is the string "BRIQ". Consequently, the codeword of the latter, that is codeword '268' is used for the second field. With respect to the string "BRID", it appears that the first string that appeared after its creation and which incorporates one more character is the string "BRIDE". The codeword of the latter, that is codeword '276' is therefore used for defining the second field.

The third field of the 44 bits data of memory 300 defines the codeword of the string (BROTHER) which appears within the dictionary after the creation of the string being considered and which shares the same characters except the last one. Let us consider the string "BRI" again. From table 2, it appears that strings "BRA" and "BRE" do share the same characters than string "BRI" except the last. They both appear as Brothers. However, table 2 reveals that they both appeared before the creation of string "BRI".

Consequently, the third field of the 44 bits data characterizing string "BRI" is set to '000'. Considering the additional example "BRIQ". Table 2 shows that the string "BRID" appears as a Brother since it has the same first characters except the one. The latter appears in the dictionary after the creation of the former. As a consequence, the third field of the 44 bits data characterizing the string "BRIQ" is set to the value '269' being equal to the codeword of string 'BRID'.

The fourth field is used for storing the codeword of the string that is defined by all the characters except the last of the string being considered (PARENT). If the latter comprises n characters, the PARENT string is the string being defined by the n-1 first characters.

In our example again, string "BRI" has a parent which is the string "BR". Consequently, the codeword of the latter, that is '259' is used for defining the fourth field of the 44 bits data stored within memory 300.

It appears from the above definitions that the second and third fields are closely related to the chronology. The date of creation of the string is therefore considered for defining the second and third field. This time relationship in the generation of the dictionary is illustrated by use of the terms SON, BROTHER and PARENT which will be used for characterizing the strings which are respectively defined by the second, the third and the fourth field. It appears that this relationship is advantageously taken into account in the structure of the processor of the invention, and particularly in the organization and arrangement of the set of registers 705, 706, 707, 708 and registers 701–704.

It should be noticed that the SON, BROTHER and PARENTS fields are initialized to "0" at the beginning of the compression process (corresponding to the fact that no BROTHER nor son nor PARENT are existing for a considered string located within the dictionary.

The particular arrangement of the memory which was described below shows that some physical locations will always remain available and unused by the dictionary. The invention utilizes this spare memory space in order to store some control data which will be used for processing the instructions by the processor 500. Due to the V. 42 bis algorithm, the (N 5-1) first dictionary entries, N5 referred to in the CCITT Recommendations as a an index number of a first dictionary entry used to store a string, will never use the PARENT and BROTHER field.

This results in some available locations within the memory which can be advantageously used for storing temporary data involved in the compression processing.

As will appear below, the processor 500 according to the present invention is useful for providing a compression system which complies with the CCITT V42bis recommendations and particularly for embodying the encoding mechanism which is defined in the recommendations and illustrated in the associated figures.

Figure 3:
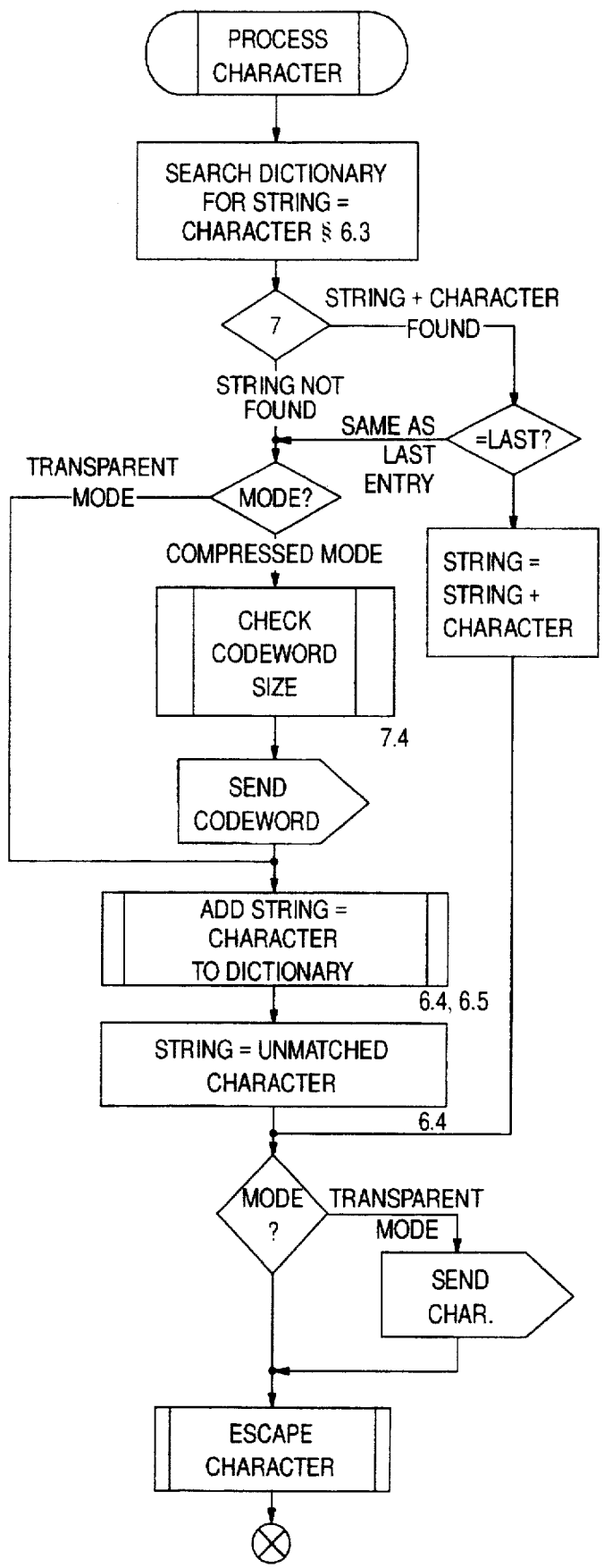
FIG. 3 reproduces the process character procedure which is defined in the FIG. I-3/V42 bis of the CCITT V42bis recommendation.

In order to demonstrate the particular advantages provided by the processor of the invention, it will be now described the embodiment of a particular procedure which is defined in the CCITT V42bis recommendation. This procedure is referred to as the 'process character procedure' which is defined in FIGS. 1–3/V.42bis of the CCITT Recommendations and is reproduced in FIG. 3 of the present application.

For the purpose of this description, the following assumptions are made:

Let us suppose that a character is received from FLOW__CONTROL1__IN circuit 100. It is signified to the processor 500 by the activation of CNTL__1__IN bus 102.

Consequently, an interrupt is generated by register 717 to state machine 600. Let us assume also that, for clarity's sake, processor 500 was executing at this time one waiting-loop, thereby waiting for an interrupt. Upon reception of the interrupt signal, state machine 600 exchanges the contents of SWAP register 715 and that of PCREG register 713. Therefore, the program branches to the address which is stored within the PCREG register 713. In our example, this results in the execution of a PROCESS CHARACTER PROCEDURE routine which will be now described with details and with reference to FIG. 4.

It will be also assumed that:

The parameters N1–N7, C1–C3 and P0–P2 which are defined in Chapter 10 of the CCITT Recommendations are stored in the PARENT fields of locations at addresses 0–12 of the memory 300 which, in the preferred embodiment of the invention, are available locations not used by the compression mechanism:

N1 is stored in the PARENT field of location at address '0'
N2 is stored in the PARENT field of location at address '1'
N3 is stored in the PARENT field of location at address '2'
N7 is stored in the PARENT field of location at address '6'
C1 is stored in the PARENT field of location at address '7'
C2 is stored in the PARENT field of location at address '8'
C3 is stored in the PARENT field of location at address '9'
P0 is stored in the PARENT field of location at address '10'
P1 is stored in the PARENT field of location at address '11'
P2 is stored in the PARENT field of location at address '12'

The flag representative of a transparent/compression mode is stored in the BROTHER field of memory location which address is '0'. A ZERO value stands for a transparent mode while a ONE value represents a compression mode. In the preferred embodiment of the invention, the codeword corresponding to a STRING as referred to in the Recommendations is stored in REG4 register 724. The codeword corresponding to the last entry within the dictionary is stored within REG5 register 725. The execution of the processing is performed by the program instructions stored in memory 400 of FIG. 1.

Figure 4:
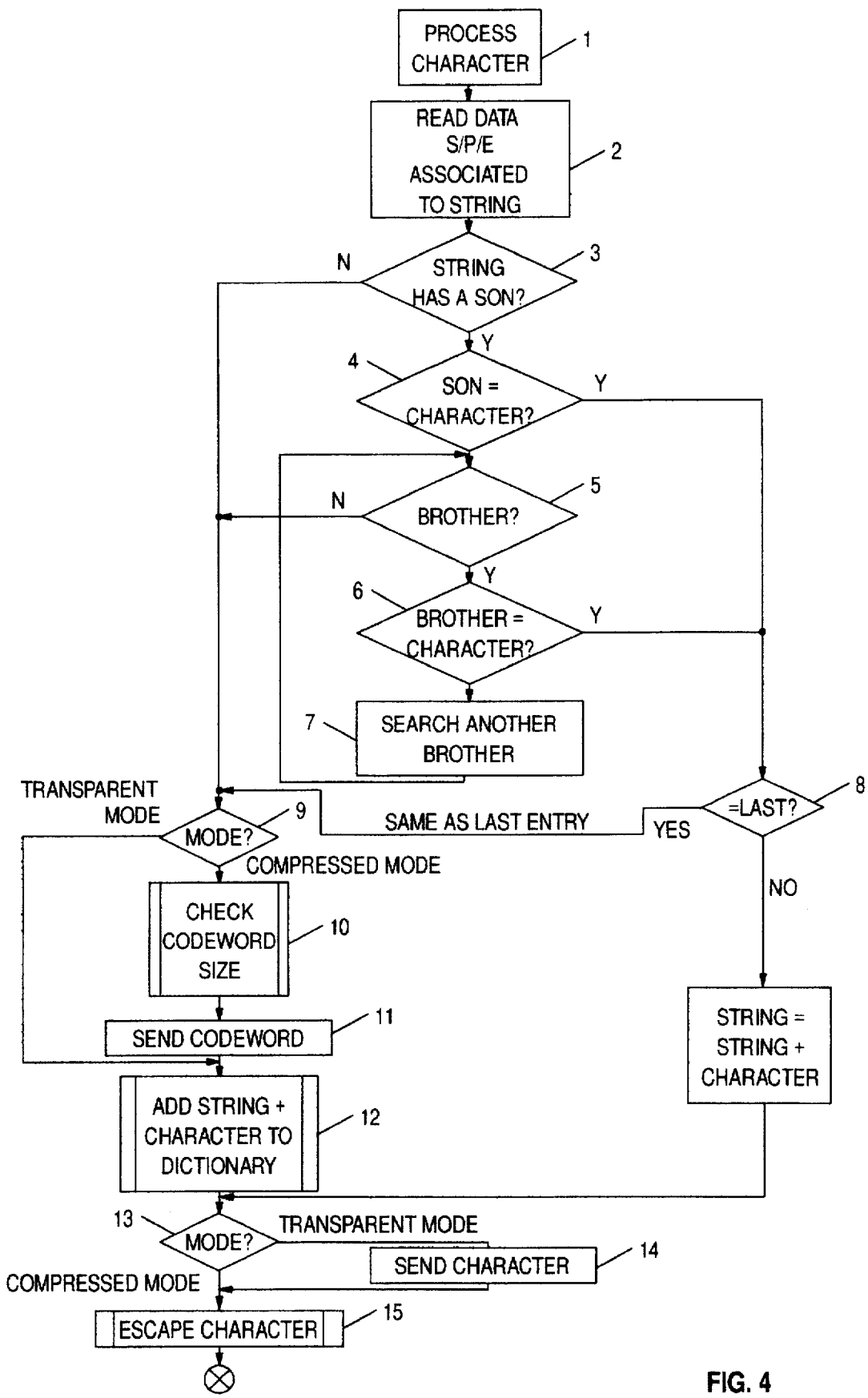
FIG. 4 is a flow chart illustrating the implementation of the process character procedure with the processor of the invention.

The implementation of the Character Process procedure will now be described with reference to FIG. 4. The initiation of the procedure starts with step 1. Then, step 2, processor 500 reads memory 400 at the address which is defined by the contents REG4 register 724 (used to store the codeword of the string). The contents of the memory is then stored in the bloc 705–708 of registers. 705–708. Then, step 3, a test is performed in order to determine whether the string has a SON or not. This is achieved by testing the second field (ie the SON field) currently stored in S12A register 706 is equal to '1'. In this case, the process proceeds to step 4 where a comparison is performed between the SON field being considered and the received character. If the SON field appears to be different from the received character, the process proceeds to step 5 where another test is performed in order to determine whether the string has a BROTHER or not. This is achieved by the checking of the contents of B12A register by means of the COMPARE instruction and the COMPREG register 718. If the string appears to have a BROTHER, then state machine 600 checks whether this BROTHER is the receive character, step 6. In the reverse case, the process proceeds to step 7 where the existence of another brother (of the received string) is checked. In the preferred embodiment of the invention, this is achieved by looping back to step 5 again.

If the tests of step 4 or that of test 6 lead to a positive result, meaning that the string associated with the received character forms a string which is already stored within the dictionary, the process proceeds to step 8. In this step, a test is performed in order to determine whether the latter string (formed by the combination of the former string with the received character) is the last string created within the dictionary. If the answer is yes, then the processor 500 goes to step 9 where an additional test is performed for determining whether the mode is either transparent or compressed. This is achieved by reading the memory at the address '0' and test the value of the BROTHER field of that location. This test is also performed when the tests performed in steps 3 and 5 lead to a negative result. If the result of the test of step 9 appears to be positive, then a CHECK CODEWORD SIZE routine is initiated, step 10. This procedure is referred to in the CCITT recommendations, illustrated in diagram c of the Appendix I and will not be discussed more for clarity's sake. It should be noticed that a call to this procedure is easily achieved with the invention by means of the SWAP instruction associated with the SWAP register. This provides a very fast way of executing a call operation since the contents of both SWAP and PCREG registers 713 and 715 can be instantaneously exchanged. At the completion of the CHECK CODEWORD SIZE routine, the process proceeds to step 11 where the codeword is transmitted to the FLOW_CONTROL_2_OUT circuit 200 by means of DATA_OUT register 726.

Then, an ADD_STRING+CHARACTER_TO_DICTIONARY procedure is initiated in step 12 which allows the addition of the string and the character being received into the dictionary, as discussed in the CCITT V42bis recommendations. This latter procedure is particularly illustrated in diagram I of the Appendix I of the Recommendations. Step 12 is also reached when the test performed in step 9 revealed the existence of a transparent mode.

After the completion of step 12, a test is performed, similar to that of step 9, in order to determine the actual mode, step 13. When in transparent mode, a step 14 results in the sending of the received character to the FLOW_CONTROL_2_OUT circuit 200. After step 15, and also when the test of step 13 revealed that the mode was not transparent, an ESCAPE CHARACTER procedure which is illustrated in diagram g of the CCITT V42bis recommendations and discussed in the latter.

When the test performed in step 8 revealed that the string and the received character is not the last string being created within the dictionary, the process proceeds to step 16 where the received character is added in the string variable in order to update the latter.

Below is listed an illustrative set of instructions for the implementation of the above described flow chart (see Table 1). Table 2 also illustrates the storage of the example of dictionary into the memory.

TABLE 1

| LABEL | INSTRUCTION | COMMENTS |
|---|---|---|
| PROCESS CHARACTER: | MOVE ADDA,REG4 ;Load in ADDA string codeword | |
| | MOVE EXTERNAL READ_MEM_TO A ;Read dictionnary entry | |
| | MOVE EXTERNAL READ_DATA ;Read character received | |
| | ILOAD COMPREG,0 ; Load compreg with value 0 | |
| | COMPARE EQUAL S12A ; Compare S12A to 0 | |
| | IJUMP POSSIBLE_SON | |
| | IJUMP STRING+CHAR_NOT_FOUND | |
| POSSIBLE_SON: | MOVE ADDA,S12A | |
| | MOVE EXTERNAL READ_MEM_TO_A ;Read Son | |
| | COMPARE EQUAL DATAIN ; Compare son to character | |
| | IJUMP BROTHER? | |
| | IJUMP STRING+CHAR_FOUND | |
| BROTHER: | ILOAD COMPREG,0 | |
| | COMPARE EQUAL,B12A ;Search for Brother | |
| | IJUMP A_BROTHER_FOUND | |
| | IJUMP STRING+CHAR_NOT_FOUND | |
| A_BROTHER_FOUND: | MOVE ADDA,B12A | |
| | MOVE EXTERNAL,READ_MEM_TO_A | |
| | MOVE COMPREG,DATA A | |
| | COMPARE EQUAL,DATAIN ;Compare brother to character | |
| | IJUMP BROTHER? | |
| | IJUMP STRING+CHAR_FOUND | |
| STRING+CHAR_FOUND: | MOVE COMPREG,REG5 | |
| | COMPARE EQUAL,ADDA | |
| | IJUMP SAME_AS_LAST_ENTRY | |
| | MOV REG5,ADDA | |
| | IJUMP MODE? | |
| SAME_AS_LAST_ENTRY: | ILOAD ADDB,0 | |
| | MOVE EXTERNAL READ_MEM_TO_B | |
| | ILOAD COMPREG,0 | |
| | COMPARE EQUAL,B12B | |
| | IJUMP ADD_STRING+CHAR_TO_DICTIO | |
| | ILOAD SWAP,ADD1 ; ADD1 is address of task check | |
| | | ; check_codeword_size minus 1 |

;The program will execute the programme check_codeword_size
;which will end with a swap instruction which will return to
;the following of the current program.
                MOVE DATA_OUT,REG4
                MOVE EXTERNAL_WRITE_CODEWORD ; Send codeword
ADD_STRING+CHAR_TO_DICTIO: ILOAD SWAP,ADD2 ; ADD2 is address of task
                                  ; add_string_+_character_
                                  ; to_dictionnary minus 1

TABLE 1-continued

| LABEL | INSTRUCTION | COMMENTS |
|---|---|---|
| ;The programm will execute the corresponding programm | | |
| ;which will end with a swap instruction which will return to | | |
| ;the following of the current programm. | | |
| | MOVE' ADREG,DATAIN | |
| | ILOAD REG6,3 | |
| | ADD REG6 | |
| | MOVE REG4,REGR | ; String=unmatched character |
| MODE?: | ILOAD ADDB,0 | |
| | MOVE EXTERNAL,READ_MEM_TO_B | |
| | ILOAD COMPREG,0 | |
| | MOVE DATA_IN,DATA_OUT | |
| | COMPARE EQUAL,B12B | |
| | MOVE EXTERNAL_WRITE_CODEWORD | |
| | ILOAD SWAP,ADD3 | ; ADD3 is address of task |
| | | ; Escape_character_procedure minus 1 |
| ;The programm will execute the corresponding programm | | |
| ;which will end with a swap instruction which will return to | | |
| ;the end of this programm | | |

TABLE 2

| | | CODEWORD/ADDRESS | CHARACTER/STRING | SON | BROTHER | PARENT |
|---|---|---|---|---|---|---|
| Reserved ( | | 000 | | | | |
| Control ( | | 001 | | | | |
| Codeword ( | | 002 | | | | |
| 1st ASCII char. | | 003 | | | | |
| A in ASCII + 3 | | 068 | | | | |
| B ----- | | 069 | | 259 | | |
| D in ASCII + 3 | | 071 | | | | |
| E in ASCII + 3 | | 072 | | | | |
| I in ASCII + 3 | | 076 | | | | |
| N in ASCII + 3 | | 081 | | | | |
| O in ASCII + 3 | | 082 | | | | |
| Q in ASCII + 3 | | 084 | | | | |
| R in ASCII + 3 | | 085 | | | | |
| S in ASCII + 3 | | 086 | | | | |
| T in ASCII + 3 | | 086 | | | | |
| U in ASCII + 3 | | 087 | | | | |
| V in ASCII + 3 | | 088 | | | | |
| 1st string in | | 259 | 85 (R) | 261 | 260 | 69 |
| Dictionnary | BR | | | | | |
| string | BU | 260 | 87 (U) | 262 | 000 | 69 |
| | BRE | 261 | 72 (E) | 263 | 264 | 259 |
| | BUT | 262 | 86 (T) | 000 | 000 | 260 |
| | BREV | 263 | 88 (V) | 265 | 000 | 261 |
| | BRA | 264 | 68 (A) | 272 | 267 | 259 |
| | BREVE | 265 | 72 (E) | 266 | 000 | 263 |
| | BREVET | 266 | 86 (T) | 000 | 000 | 265 |
| | BRI | 267 | 76 (I) | 268 | 000 | 259 |
| | BRIQ | 268 | 84 (Q) | 274 | 269 | 267 |
| | BRID | 269 | 71 (D) | 276 | 270 | 267 |
| | BRIN | 270 | 81 (N) | 000 | 271 | 267 |
| | BRIO | 271 | 82 (O) | 000 | 000 | 267 |
| | BRAV | 272 | 88 (V) | 273 | 000 | 264 |
| | BRAVO | 273 | 82 (O) | 000 | 000 | 272 |
| | BRIQU | 274 | 87 (U) | 275 | 000 | 268 |
| | BRIQUE | 275 | 72 (E) | 000 | 000 | 274 |
| | BRIDE | 276 | 72 (E) | 000 | 000 | 269 |

We claim:

1. A processor for performing data compression, said processor being connected by means of an external bus (301, 302) to at least one memory storage (300, 400) for storing a set of instructions as well as data representative of a dictionary consisting of a set of strings with a codeword for each of said strings and including all possible strings of one byte in length, characterized in that said processor comprises:

an internal bus (650);

a first set of four registers (701, 702, 703, 704) connected between said external and said internal bus for storing data representative of a dictionary entry read from said memory storage (300), said first set comprising a first latch (701) for storing, in a first field, a codeword for the last character of a string being stored, a second latch (702) for storing, in a second field, a codeword for a SON string comprising the current string plus an additional character, a third latch (703) for storing, in a third field, a codeword for a BROTHER string comprising a dictionary entry which follows a dictionary entry for the current string and which differs from the current string only by having a different last character, and a fourth latch (704) for storing, in a fourth field, a PARENT string which consists of the current string minus the last character;

a second set of four registers (705, 706, 707, 708) connected between said external and said internal bus for storing data representative of said dictionary entry read from said memory storage (300); said second set comprising a first latch (705), a second latch (706), a third latch (707) and a fourth latch (708) for respectively storing said first, second, third and fourth fields of the data entry extracted from said memory storage (300);

a program counter register (713) for storing an instruction address for addressing said at least one memory storage (300); and a processing unit (600) for receiving instructions stored in said at least one memory storage (300) and for generating control signals needed in said processor (500).

2. A processor according to claim 1 characterized in that it further comprises a SWAP register (715) receiving a SWAP control signal from said processing unit; said SWAP control signal resulting in the mutual exchange of the contents of said SWAP register and said program counter register.

3. A processor according to claim 2 characterized in that it further comprises a COMPREG register (718) and a comparator (810) for performing a comparison between the data carried by said internal bus and the contents of said COMPREG register; said comparator receiving first (COUP) and second (SE__LE) control signals which respectively control the comparison operation and the number of bits which will be used for performing said comparison.

4. A processor according to claim 3 characterized in that it further comprises a MASK register (717) which receives external data flow control signals representative of data flow control, such as a DTE data flow control, said MASK register being under control of said processing unit (600) and causing interrupt signal to be generated and transmitted to said processing unit upon the detection of a change in the level of external data flow control signals (CNTL__1__IN; CNTL__2__IN).

5. A processor according to claim 4 characterized in that it further comprises a Boolean circuit (830) connected to a REGL register (727), said Boolean receiving control signals from said processing unit (600) for performing an AND or an OR operation between the contents of said REGL register and said internal bus.

6. A processor according to claim 5 characterized in that said processing unit (600) comprises means for decoding a MOVE instruction received from said external bus and correspondingly generating appropriate control signals to execute a move of the contents of one register into another register.

7. A processor according to claim 5 characterized in that said processing unit (600) comprises means for decoding a COMPARE instruction received from said external bus and for generating appropriate control signals for performing the comparison of the contents of a register with the contents of said COMPREG register (718).

8. A processor according to claim 5 characterized in that said processing unit (600) comprises means for decoding an ADD instruction received from said external bus and for generating appropriate control signals for executing an arithmetic addition of the contents of one ADREG register with the contents of another ADREG register as defined in said ADD instruction.

9. A processor according to claim 5 characterized in that said processing unit (600) comprises means for decoding an INDIRECT JUMP instruction received from said external bus and for generating appropriate control signals for executing the transfer of the contents of a register defined by said INDIRECT JUMP instruction into said program counter register (713).

10. A processor according to claim 5 characterized in that said processing unit (600) comprises means for decoding an ILOAD instruction received from said external bus and for generating appropriate control signals thereby executing the loading of a REG1 register (712) with the 6 most significant bits of a register defined by said ILOAD instruction and the 6 least significant bits of a second register that is also defined by said ILOAD instruction.

* * * * *